(12) United States Patent
Kim et al.

(10) Patent No.: US 7,309,532 B2
(45) Date of Patent: Dec. 18, 2007

(54) CYCLOPENTAPHENANTHRENE-BASED COMPOUND AND ORGANOELECTROLUMINESCENT DEVICE EMPLOYING THE SAME

(75) Inventors: Kyu-Sik Kim, Suwon-si (KR);
Byung-Hee Sohn, Yongin-si (KR);
Lyong-Sun Pu, Suwon-si (KR);
Jhun-Mo Son, Yongin-si (KR);
Sang-Hoon Park, Seongnam-si (KR);
Ji-Hoon Lee, Daejeon-si (KR);
Woon-Jung Paek, Daejeon-si (KR)

(73) Assignee: Samsung SDI Co., Ltd., Suwon (KR)

( * ) Notice: Subject to any disclaimer, the term of this patent is extended or adjusted under 35 U.S.C. 154(b) by 419 days.

(21) Appl. No.: 10/954,302

(22) Filed: Oct. 1, 2004

(65) Prior Publication Data
US 2005/0106418 A1    May 19, 2005

(30) Foreign Application Priority Data
Oct. 2, 2003  (KR) .................. 10-2003-0068613

(51) Int. Cl.
*H01L 51/54* (2006.01)
*C09K 11/06* (2006.01)

(52) U.S. Cl. ............... 428/690; 428/917; 313/504; 313/506; 257/40; 257/E51.026; 257/E51.027; 257/E51.028; 257/E51.049; 257/E51.05; 548/420; 548/457

(58) Field of Classification Search ............. 528/380, 528/397, 403, 417, 423; 548/420, 42, 457; 549/42, 457; 585/27
See application file for complete search history.

(56) References Cited

U.S. PATENT DOCUMENTS

| 4,910,218 | A | * | 3/1990 | Bair .................. 514/443 |
| 5,621,131 | A | | 4/1997 | Kreuder et al. |
| 5,763,636 | A | | 6/1998 | Kreuder et al. |
| 5,859,211 | A | | 1/1999 | Kreuder et al. |
| 5,900,327 | A | | 5/1999 | Pei et al. |

OTHER PUBLICATIONS

S. Welter, et al., "Electroluminescent Device with Reversible Switching Between Red and Green Emission" NATURE, Jan. 2, 2003, vol. 421, pp. 54-57.

* cited by examiner

*Primary Examiner*—Milton I. Cano
*Assistant Examiner*—Brett A Crouse
(74) *Attorney, Agent, or Firm*—H.C. Park & Associates, PLC

(57) ABSTRACT

The present invention is related to a cyclopentaphenanthrene-based compound and an organic electroluminescence device using the same. In particular, the cyclopentaphenanthrene-based compound offers several advantages, including easy processibility, high solubility, superior color purity, color stability and thermal stability. Moreover, the cyclopentaphenanthrene-based compound may be used not only as a material for forming an organic layer of an organic electroluminescence device, particularly, a light-emitting layer, but also as a material of an organic pigment or nonlinear optical substance.

19 Claims, 2 Drawing Sheets

CYCLOPENTAPHENANTHRENE-BASED COMPOUND AND ORGANOELECTROLUMINESCENT DEVICE EMPLOYING THE SAME

CROSS-REFERENCE TO RELATED APPLICATIONS

This application claims priority to Korean Patent Application No. 2003-68613, filed Oct. 2, 2003, in the Korean Intellectual Property Office, the disclosure of which is incorporated herein in its entirety by reference.

FIELD OF THE INVENTION

The present invention is related to a cyclopentaphenanthrene-based compound and an organic electroluminescence device using the same. More particularly, the present invention is directed to an organic layer composed of a cyclopentaphenanthrene-based compound, and an organic electroluminescence device employing the same.

BACKGROUND

In general, organic electroluminescence (EL) devices comprise an anode, an organic light emitting layer and a cathode. Within the organic light emitting layer, excitons are formed in a process called exciton formation or polaron recombination whereby oppositely charged carriers, i.e., electrons and holes, recombine. The radiative decay of the excited excitons produced by the recombination process to their ground state results in electroluminescence.

The organic light emitting layer may be formed using low molecular weight electroluminescent materials. Consequently, this will enable luminescence over a wide wavelength range from the UV region to the IR region. For example, Welter et al., 421(6918) NATURE, 54-57 (2003) describes an EL device comprising a film of a conjugated polyphenylenevinylene (PPV) polymer as the light-emitting layer. Additionally, PPV-type polymers have been developed which are soluble in an organic solvent, have high chemical stability and a high luminous efficiency.

Although poly(fluorene) compounds having better performance than the PPV-type polymer as the light-emitting layer material have been developed, color purity, however, is still unsatisfactory. See U.S. Pat. No. 5,900,327. Therefore, electroluminescence materials capable of improving the color purity of EL devices are being developed. For example, U.S. Pat. Nos. 5,763,636, 5,621,131 and 5,859,211, disclose spirobifluorene or a hetero atom containing spirofluorene as electroluminescence materials capable of improving the property profile of EL devices.

Organic electroluminescence devices manufactured using the existing light-emitting materials, however, are still required to be further improved, particularly for efficiency, color purity and the like.

SUMMARY OF THE INVENTION

The present invention is related to a cyclopentaphenanthrene-based compound having a cyclopentaphenanthrene structure, which has improved luminous efficiency, thermal stability and color purity. Furthermore, the present invention is related to an organic electroluminescence device employing the cyclopentaphenanthrene-based compound.

In one aspect of the present invention, a cyclopentaphenanthrene-based compound represented by Formula 1:

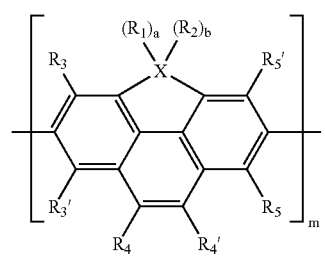

Formula 1 where X may be C, N, O or S: when X is C, a and b may be both 1; when X is N, one of a and b may be 0; and when X is O or S, a and b may both be 0 is provided.

Furthermore, $R_1$ and $R_2$ may each independently be a hydrogen, a substituted or unsubstituted $C_1$-$C_{30}$ alkyl, a substituted or unsubstituted $C_3$-$C_{30}$ cycloalkyl, a substituted or unsubstituted $C_1$-$C_{30}$ alkoxy, a substituted or unsubstituted $C_6$-$C_{30}$ aryl, a substituted or unsubstituted $C_6$-$C_{30}$ aryloxy, a substituted or unsubstituted $C_6$-$C_{30}$ arylalkyl, a substituted or unsubstituted $C_2$-$C_{30}$ heteroaryl, a substituted or unsubstituted $C_6$-$C_{30}$ heteroaryloxy, and a substituted or unsubstituted $C_2$-$C_{30}$ heteroaryloxy. Alternatively, $R_1$ and $R_2$ may be linked to form a saturated or unsaturated $C_3$-$C_{30}$ ring system. Additionally, $R_3$, $R_3'$, $R_4$, $R_4'$, $R_5$ and $R_5'$ may each independently be a hydrogen, a hydroxy, a substituted or unsubstituted amino, a cyano, a halogen atom, a substituted or unsubstituted $C_1$-$C_{30}$ alkyl, a substituted or unsubstituted $C_3$-$C_{30}$ cycloalkyl, a substituted or unsubstituted $C_1$-$C_{30}$ alkoxy, a substituted or unsubstituted $C_6$-$C_{30}$ aryl, a substituted or unsubstituted $C_6$-$C_{30}$ arylalkyl, and a substituted or unsubstituted $C_2$-$C_{30}$ heteroary. Moreover, m may be a real number in the range of about 2 to about 5,000.

In an alternate aspect, the cyclopentaphenanthrene-based compound may further comprise an arylene (Ar) repeating unit such as represented by Formula 2 below:

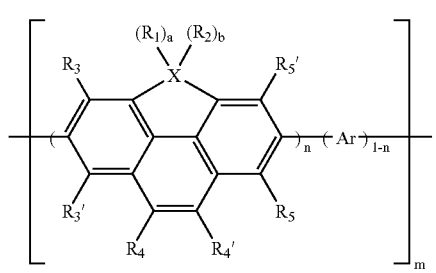

Formula 2 where Ar may be a substituted or unsubstituted $C_6$-$C_{30}$ arylene, or a substituted or unsubstituted $C_2$-$C_{30}$ heteroarylene group. Furthermore, X may be C, N, O or S. Specificially, when X is C, a and b may be both 1; when X is N, one of a and b may be 0; and when X is O or S, a and b may both be 0.

Addtionally, $R_1$ and $R_2$ may each independently be a hydrogen, a substituted or unsubstituted $C_1$-$C_{30}$ alkyl, a substituted or unsubstituted $C_3$-$C_{30}$ cycloalkyl, a substituted or unsubstituted $C_1$-$C_{30}$ alkoxy, a substituted or unsubstituted $C_6$-$C_{30}$ aryl, a substituted or unsubstituted $C_6$-$C_{30}$ aryloxy, a substituted or unsubstituted $C_6$-$C_{30}$ arylalkyl, a substituted or unsubstituted $C_2$-$C_{30}$ heteroaryl, a substituted or unsubstituted $C_6$-$C_{30}$ heteroaryloxy, and a substituted or unsubstituted $C_2$-$C_{30}$ heteroaryloxy. Alternatively, $R_1$ and $R_2$ may be linked to form a saturated or unsaturated $C_3$-$C_{30}$ ring system. Additionally, $R_3$, $R_3'$, $R_4$, $R_4'$, $R_5$ and $R_5'$ may each independently be a hydrogen, a hydroxy, a substituted or unsubstituted amino, a cyano, a halogen atom, a substituted or unsubstituted $C_1$-$C_{30}$ alkyl, a substituted or unsubstituted $C_3$-$C_{30}$ cycloalkyl, a substituted or unsubstituted $C_1$-$C_{30}$ alkoxy, a substituted or unsubstituted $C_6$-$C_{30}$ aryl, a substituted or unsubstituted $C_6$-$C_{30}$ arylalkyl, and a substituted or unsubstituted $C_2$-$C_{30}$ heteroary. Additionally, m may be a real number in the range of about 2 to about 5,000 and n may be a real number in the range of about 0.01 to about 1.

In a further aspect of the present invention, an organic electroluminescent device comprising an organic layer between a pair of electrodes, where the organic layer comprises the cyclopentaphenanthrene-based compound is provided.

BRIEF DESCRIPTION OF THE DRAWINGS

The above and other features and advantages of the present invention will become more apparent by describing in detail exemplary embodiments thereof with reference to the attached drawings.

DETAILED DESCRIPTION OF THE INVENTION

Figure 1:
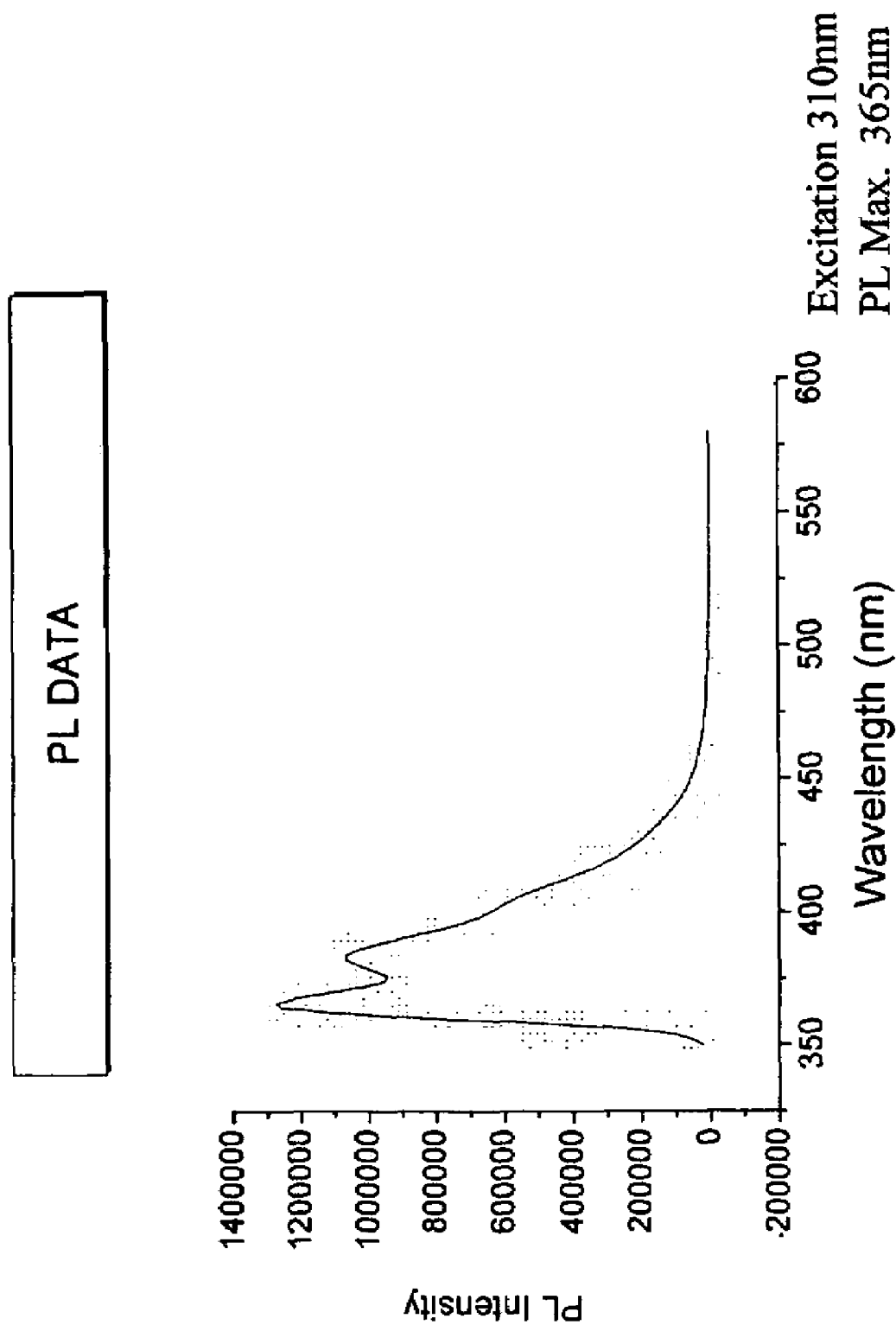
FIG. 1 depicts the photoluminescence (PL) spectrum of poly(dioctylcyclopentaphenanthrene-CO-phenoxazine) according to Example 4 of the present invention.

The present invention is directed to a cyclopentaphenanthrene-based compound represented by Formula 1. In addition, the present invention also provides a cyclopentaphenanthrene-based compound represented by Formula 2, which further comprises arylene repeating units. Referring to Formula 2, n may be defined as a mixed proportion of the cyclopentaphenanthrene repeating units comprised in the overall polymer, and 1-n may be defined as a mixed proportion of the arylene repeating units comprised in the overall polymer.

Referring to Formula 1, n may be a real number in the range of about 0.01 to about 1. Specifically, n may be a number in the range of about 0.5 to about 1. In Formula 1, when $R_1$ and $R_2$ form a ring, a $C_3$-$C_{30}$ substituted or unsubstituted ring may be formed. In this case, the ring may contain a hetero atom such as N, O or S.

According to an embodiment of the present invention, examples of the one or more substituted alkyl, cycloalkyl, alkoxy, aryl, arylalkyl, heteroaryl, amino and/or corresponding ring of Formula 1 may include, but are not limited to, a $C_1$-$C_{12}$ alkyl, $C_1$-$C_{12}$ alkoxy, halogen atom, $C_1$-$C_{12}$ lower alkylamino, hydroxy, nitro, cyano, substituted or unsubstituted amino(—$NH_2$, —NH(R), —N(R')(R"), where R' and R" may each independently be a $C_1$-$C_{12}$ alkyl, a carboxyl, sulfonic acid, phosphoric acid, a $C_1$-$C_{20}$ halogenated alkyl, a $C_2$-$C_{20}$ alkenyl, a $C_2$-$C_{20}$ alkynyl, a $C_1$-$C_{20}$ heteroalkyl, a $C_6$-$C_{30}$ aryl, a $C_6$-$C_{20}$ arylalkyl, a $C_2$-$C_{20}$ heteroaryl, or a $C_2$-$C_{20}$ heteroarylalkyl group.

In a particular embodiment, the arylene (Ar) unit of Formula 1 may have a structure represented by Formula 3, as shown below. Specifically, the structure may be a phenoxazine.

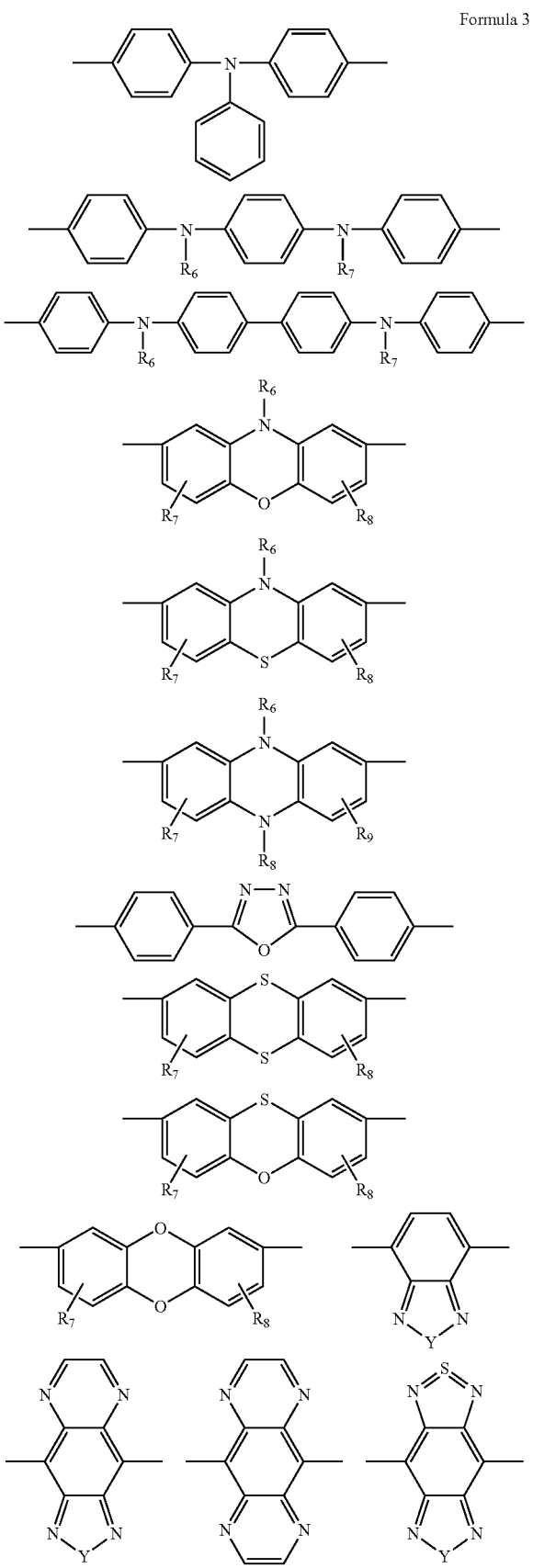

Formula 3

-continued

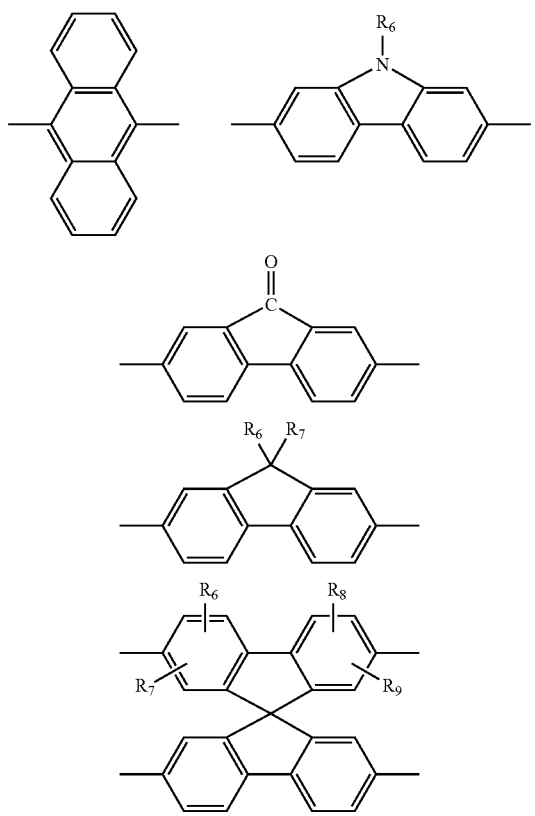

where Y may be 0 or S; $R_6$, $R_7$, $R_8$ and $R_9$ may each independently be a hydrogen, a hydroxy, a substituted or unsubstituted amino, a cyano, a halogen atom, a substituted or unsubstituted $C_1$-$C_{30}$ alkyl, substituted or unsubstituted $C_3$-$C_{30}$ cycloalkyl, a substituted or unsubstituted $C_1$-$C_{30}$ alkoxy, a substituted or unsubstituted $C_6$-$C_{30}$ aryl, or a substituted or unsubstituted $C_2$-$C_{30}$ heteroaryl group, for example.

In a further embodiment, the cyclopentaphenanthrene-based compound represented by Formula 1 may include a compound represented by Formula 6, as depicted below:

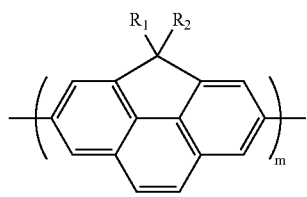

Formula 6 where $R_1$ and $R_2$ may each independently be a substituted or unsubstituted $C_1$-$C_{12}$ alkyl; and where m may be a real number in the range of about 2 to about 5,000.

In the cyclopentaphenanthrene-based compound represented by Formula 1, examples of the ring produced by $R_1$ and $R_2$ may include a compound represented by Formula 5, as illustrated below:

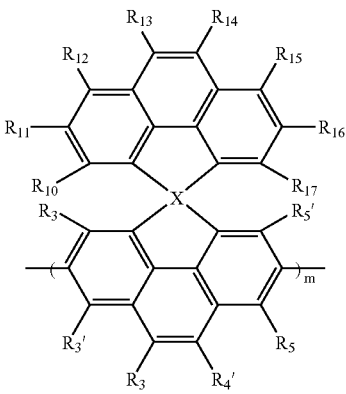

Formula 5 where $R_3$, $R_4$, $R_5$, $R_3'$, $R_4'$, $R_5'$, $R_{10}$, $R_{11}$, $R_{12}$, $R_{13}$, $R_{14}$, $R_{15}$, $R_{16}$, and $R_{17}$, and m are defined as described above.

In an additional embodiment, examples of the compound represented by Formula 6 may include a compound represented by Formula 7, as shown below:

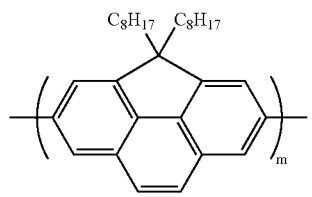

Formula 7

According to an embodiment of the present invention, in the cyclopentaphenanthrene-based compound represented by Formula 2, the ring produced by interconnecting $R_1$ and $R_2$ may be a compound represented by Formula 4, as shown below:

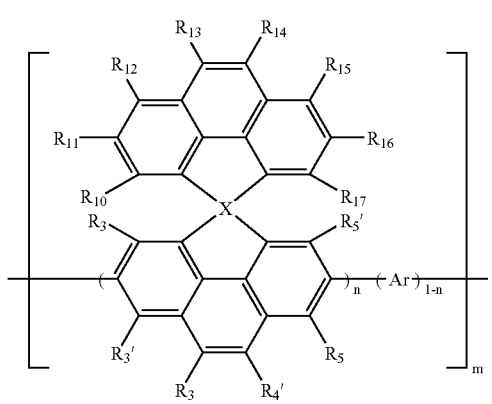

Formula 4 where Ar, $R_3$, $R_3'$, $R_4$, $R_4'$, $R_5$, $R_5'$, X, n and m are defined as described above; and where $R_{10}$, $R_{11}$, $R_{12}$, $R_{13}$, $R_{14}$, $R_{15}$, $R_{16}$, and $R_{17}$ may each independently be a hydrogen, a hydroxy, a substituted or unsubstituted amino, a cyano, a halogen atom, a substituted or unsubstituted $C_1$-$C_{30}$ alkyl, a substituted or unsubstituted $C_3$-$C_{30}$ cycloalkyl, a substituted or unsubstituted $C_1$-$C_{30}$ alkoxy, a substituted or unsubstituted $C_6$-$C_{30}$ aryl, a substituted or unsubstituted $C_6$-$C_{30}$ aryloxy, a substituted or unsubstituted $C_6$-$C_{30}$ arylalkyl, a substituted or unsubstituted $C_2$-$C_{30}$ heteroaryl, or a substituted or unsubstituted $C_2$-$C_{30}$ heteroaryloxy group, for example.

Further examples of the compound represented by Formula 4 may include a compound represented by Formula 8, as illustrated below:

Formula 8

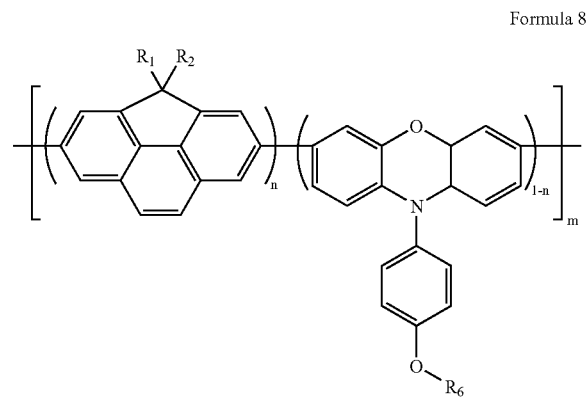

where $R_1$, $R_2$ and $R_6$ may each independently be a substituted or unsubstituted $C_1$-$C_{12}$ alkyl group; where n may be a real number in the range of about 0.01 to about 0.99; and where m may be a real number in the range of about 2 to about 5,000.

Examples of the compound represented by Formula 8 may include a compound represented by Formula 9, as shown below:

Formula 9

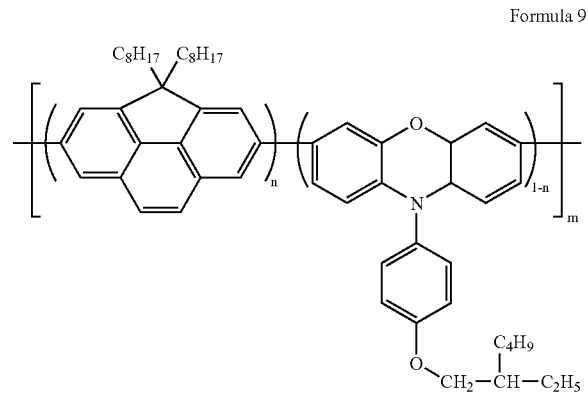

where n may be a real number in the range of about 0.01 to about 0.99; and where m may be a real number in the range of about 2 to about 5,000.

The cyclopentaphenanthrene-based compound of the present invention may offer several processing advantages, including easy processibility, high solubility, superior color purity, color stability and thermal stability. The cyclopentaphenanthrene-based compound according to the present invention may be obtained by polymerizing single substances made from novel cyclopentaphenanthrene-based compounds or spirocyclopentaphenanthrene-based compounds, or by copolymerizing the same with an arylene (Ar) monomer having a halide. The degree of polymerization of the cyclopentaphenanthrene-based compound containing the repeating unit represented by Formula 1 may be 15 or more, and in particular, between 15 and 350. In a specific embodiment, the average molecular weight of the compound may not be less than 10,000. Moreover, the average molecular weight of the compound may be in the range of about 10,000 to about 200,000. In this case, the compound exhibits good film formability.

The organic electroluminescence device according to the present invention is manufactured by forming an organic layer, particularly a light-emitting layer, using the cyclopentaphenanthrene-based compound represented by Formula 1. The cyclopentaphenanthrene-based compound represented by Formula 1 may be used as a material for forming a light-emitting layer, particularly, a blue light-emitting material. Also, the cyclopentaphenanthrene-based compound may be used as a material for forming a organic layer such as a hole transport layer.

Specifically, the cyclopentaphenanthrene-based compound represented by Formula 1 may be present in an amount in the range of about 1 part to about 30 parts by weight based on the total weight of the material for forming the light-emitting layer. Examples of methods useful to introduce the cyclopentaphenanthrene-based compound to the light-emitting layer include vacuum deposition, sputtering, coating, ink-jet printing, and electron-beam radiation.

In particular, the thickness of the organic layer may in a range of about 50 nm to about 100 nm. The term "organic layer" used herein refers to a layer made of an organic compound formed between a pair of electrodes in an organic electroluminescent device, for example, a light-emitting layer, an electron transport layer, a hole transport layer, and the like.

The organic electroluminescent device may have a structure such as an anode/light-emitting layer/cathode, an anode/buffer layer/light-emitting layer/cathode, an anode/hole transport layer/light-emitting layer/cathode, an anode/buffer layer/hole transport layer/light-emitting layer/cathode, an anode/buffer layer/hole transport layer/light-emitting layer/electron transport layer/cathode, and an anode/buffer layer/hole transport layer/light-emitting layer/hole blocking layer/cathode, for example.

In additional embodiments, the buffer layer may include any materials commonly used in the art, and may be, for example, copper phthalocyanine, polythiophene, polyaniline, polyacetylene, polypyrrole, polyphenylene vinylene, and derivatives thereof. The hole transport layer may include any materials commonly used in the art, and specifically may be polytriphenylamine. The electron transport layer may include any materials commonly used in the art, and in particular may be polyoxadiazole. The hole blocking layer may include any materials commonly used in the art, and specifically may be LiF, $BaF_2$ or $MgF_2$.

Hereinafter, the present invention will now be described in more detail with reference to the following Examples. These examples, however, are given for the purpose of illustration and not of limitation.

EXAMPLES

Specific Example 1

Synthesis of 4,4-dioctyl-cyclopenta[def]phenanthrene 3 g (15.76 mmol) of cyclopenta[def]phenanthrene and 7.74 ml (44.80 mmol) of octylbromide were dissolved in 300 ml of tetrahydrofuran. 94.68 ml of 1M potassium t-butoxide was slowly added dropwise thereto, heated at 50° C., stirred for 1 hour, and concentrated under reduced pressure to remove tetrahydrofuran. Then, 300 ml of ethylacetate was added to the reaction mixture for extraction, and then washed with brine. The resultant product was washed once with distilled water, and an ethylacetate layer was dehydrated using $MgSO_4$, followed by filtering and concentrating under reduced pressure. The produced mixture was isolated by silica gel column chromatography (eluent: hexane), giving 4.68 g of the target product, 4,4-dioctyl-cyclopenta[def]phenanthrene, at a yield of 71.67%.

The compound was characterized using proton NMR as follows: $^1$H-NMR($CDCl_3$): ppm, 0.80(m, 10H, octyl), 1.07-1.25(m, 20H, octyl), 2.10-2.17(m, 4H, octyl), 7.49(m, 2H, aromatic), 7.60(m, 2H, aromatic), 7.79(m, 4H, aromatic). Additionally, the compound was characterized using mass spectroscopy as follows: Mass: 414(M+), 301, 189.

Specific Example 2

Synthesis of 4,4-dioctyl-2,6-dibromocyclopenta[def]phenanthrene 3 g (7.2 mmol.) of 4,4-dioctyl-cyclopenta[def]phenanthrene as prepared in Example 1 was added to a reaction flask and was dissolved in 50 ml of methylene chloride. Then, as the reaction was kept in the dark, a solution obtained by diluting 0.74 ml of bromine in 37 ml of methylene chloride at room temperature was slowly added dropwise to the reaction mixture. After adding dropwise, the reaction mixture was stirred for about 30 minutes and then concentrated under reduced pressure. The produced mixture was isolated by silica gel column chromatography (eluent: hexane), giving 2.17 g of the target product, 4,4-dioctyl-2,6-dibromocyclopenta[def]phenanthrene at 52.5% yield.

The compound was characterized using proton NMR as follows: $^1$H-NMR($CDCl_3$): ppm, 0.80(m, 10H, octyl), 1.07-1.21(m, 20H, octyl), 2.10-2.14(m, 4H, octyl), 7.35(d, 1H, aromatic), 7.53(d, 1H, aromatic), 7.65(t,H, aromatic), 7.79 (d, 1H, aromatic), 7.82,7.93(dd, 2H, aromatic). Moreover, the compound was characterized using mass spectroscopy as follows: Mass: 572(M+), 494, 381, 300, 215, 201.

Specific Example 3

Synthesis of poly(dioctycyclopentaphenanthrene)

First, a Schlenk flask was vacuumed and refluxed with nitrogen gas several times to completely remove the moisture. Then, 480 mg (1.7 mmol) of bis(1,5-cyclooctadiene) nickel(O) and 273 mg (1.7 mmol) of 2,2'-bipyridine were charged into the Schlenk flask in a glove box. The flask was then vacuumed and refluxed several times using nitrogen gas. 4 ml of anhydrous dimethyl formamide (DMF), 0.2 ml of 1,5-cyclooctadie (COD) and 5 ml of anhydrous toluene were then added to the flask under a nitrogen atmosphere. After the mixture was stirred at 70° C. for 30 minutes, a solution obtained by diluting 500 mg (0.873 mmol) of 4,4-dioctyl-2,6-dibromocyclopenta[def]phenanthrene as prepared in Example 2 in 8 ml of toluene was added to the reaction mixture. The reaction mixture was refluxed at 70° C. for 24 hours and cooled to room temperature.

The reactant was treated with an acid solution, e.g., a mixed solution comprising HCl, acetone and methanol in a volume ratio of 1:1:2, giving precipitates. The precipitates were purified with toluene and methanol, followed by a treatment using a soxhlet extractor, resulting in the final product at 70% yield. Using a gel permeation chromatography analysis, the average molecular weight (MW) of the final product was approximately 50,000.

Specific Example 4

Synthesis of poly(dioctylcyclopentaphenanthrene-CO-phenoxazine) (90:10 mole ratio)

Reaction Scheme 1

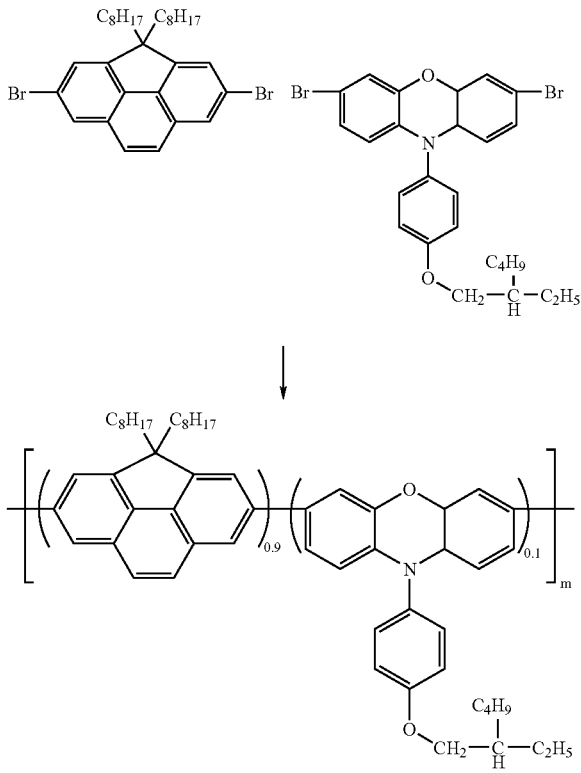

A Schlenk flask was first vacuumed and refluxed with nitrogen gas several times to completely remove the moisture. Then, 534 mg (1.9 mmol) of bis(1,5-cyclooctadiene) nickel(O) and 300 mg (1.9 mmol) of 2,2'-bipyridine were charged into the Schlenk flask in a glove box, and then the flask was vacuumed and refluxed using nitrogen gas several times again. 4 ml of anhydrous dimethyl formamide (DMF), 0.2 ml of 1,5-cyclooctadie (COD) and 8 ml of anhydrous toluene, were added to the flask under a nitrogen atmosphere. The reaction mixture was stirred at 70° C. for 30 minutes. A solution obtained by diluting 500 mg (0.9 mmol) of 4,4-dioctyl-2,6-dibromocyclopenta[def]phenanthrene as prepared in Example 2 and 53 mg (0.1 mmol) of 3,7-dibromo-10-[4-(2-ethyl-hexyloxy)-phenyl]-10,10a-dihydro-4aH-phenoxazine, which is a dibromophenoxazine derivative in 8 ml of toluene was added to the reaction mixture. The reaction mixture was refluxed at 70° C. for 24 hours and cooled to room temperature. The reactant was treated with an acid solution, e.g., a mixed solution comprising HCl, acetone and methanol in a volume ratio of 1:1:2, giving precipitates. The precipitates were purified with toluene and methanol, followed by treatment using a soxhlet extractor, giving the final product at 65% yield. Using GPC analysis, the number average molecular weight of the final product was approximately 56,000.

Figure 2:
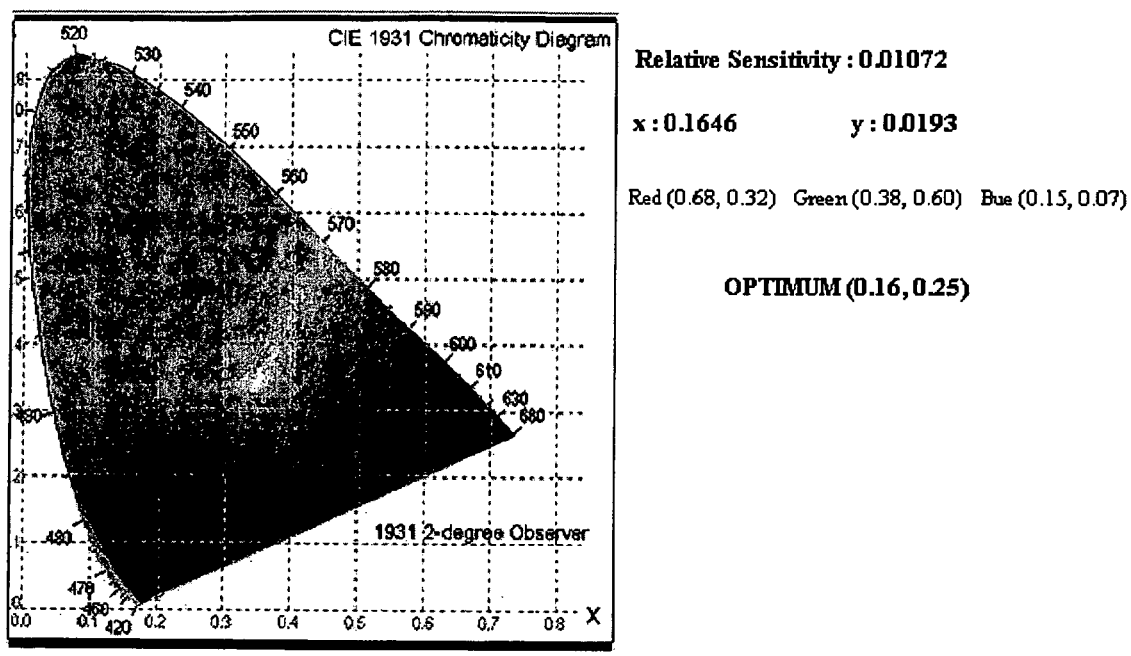
FIG. 2 shows the color purity characteristic of poly(dioctylcyclopentaphenanthrene-CO-phenoxazine) according to Example 4 of the present invention.

PL and color purity characteristics of the poly(dioctylcyclopentaphenanthrene-CO-phenoxazine) is shown FIGS. 1 and 2. Referring to FIG. 1, the poly(dioctylcyclopentaphenanthrene-CO-phenoxazine) has a maximum emission peak at 365 nm. The color purity of the poly(dioctylcyclopentaphenanthrene-CO-phenoxazine) at this wavelength is CIE(x,y): 0.16, 0.25 in an NTSC chromaticity coordinate system.

The cyclopentaphenanthrene-based compound offers significant processing advantages, such as easy processibility, high solubility, superior color purity, color stability, thermal stability and so on. Furthermore, the compound of the present invention may be advantageously used not only as a material for forming an organic layer of an organic electroluminescence device, particularly, a light-emitting layer, but also as a material of an organic pigment or nonlinear optical substance.

What is claimed is:

1. A cyclopentaphenanthrene-based compound represented by Formula 1,

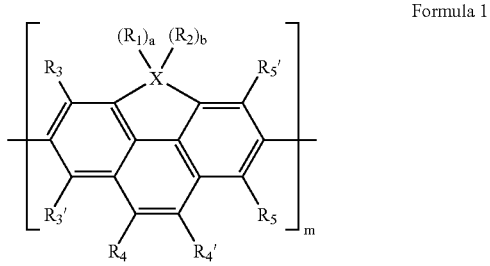

Formula 1 wherein X is C, N, O, or S, where when X is C, a and b are both 1, when X is N, one of a and b is 0, and when X is O or S, a and b are both 0;

wherein $R_1$ and $R_2$ are each selected from the group consisting of hydrogen, a substituted or unsubstituted $C_1$-$C_{30}$ alkyl, a substituted or unsubstituted $C_3$-$C_{30}$ cycloalkyl, a substituted or unsubstituted $C_1$-$C_{30}$ alkoxy, a substituted or unsubstituted $C_6$-$C_{30}$ aryl, a substituted or unsubstituted $C_6$-$C_{30}$ aryloxy, a substituted or unsubstituted $C_6$-$C_{30}$ arylalkyl, a substituted or unsubstituted $C_2$-$C_{30}$ heteroaryl, a substituted or unsubstituted $C_6$-$C_{30}$ heteroaryloxy, and a substituted or unsubstituted $C_2$-$C_{30}$ heteroaryloxy group, or wherein $R_1$ and $R_2$ are interconnected to form a saturated or unsaturated $C_3$-$C_{30}$ ring; $R_3$, $R_3'$, $R_4$, $R_4'$, $R_5$ and $R_5'$ are each independently selected from the group consisting of a hydrogen, a hydroxy, a substituted or unsubstituted amino, a cyano, a halogen atom, a substituted or unsubstituted $C_1$-$C_{30}$ alkyl, a substituted or unsubstituted $C_3$-$C_{30}$ cycloalkyl, a substituted or unsubstituted $C_1$-$C_{30}$ alkoxy, a substituted or unsubstituted $C_6$-$C_{30}$ aryl, a substituted or unsubstituted $C_6$-$C_{30}$ arylalkyl, and a substituted or unsubstituted $C_2$-$C_{30}$ heteroaryl group;

wherein $R_1$ and $R_2$ are not both hydrogen; and wherein m is an integer in the range of 2 to about 5,000.

2. A cyclopentaphenanthrene-based compound represented by Formula 2, wherein the compound comprises an arylene repeating unit (Ar),

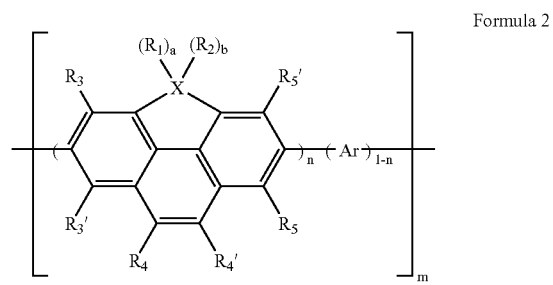

Formula 2 wherein X is C, N, O or S, where when X is C, a and b are both 1, when X is N, one of a and b is 0, and when X is O or S, a and b are both 0;

wherein $R_1$ and $R_2$ are each selected from the group consisting of hydrogen, a substituted or unsubstituted $C_1$-$C_{30}$ alkyl, a substituted or unsubstituted $C_3$-$C_{30}$ cycloalkyl, a substituted or unsubstituted $C_1$-$C_{30}$ alkoxy, a substituted or unsubstituted $C_6$-$C_{30}$ aryl, a substituted or unsubstituted $C_6$-$C_{30}$ aryloxy, a substituted or unsubstituted $C_6$-$C_{30}$ arylalkyl, a substituted or unsubstituted $C_2$-$C_{30}$ heteroaryl, a substituted or unsubstituted $C_6$-$C_{30}$ heteroaryloxy, and a substituted or unsubstituted $C_2$-$C_{30}$ heteroaryloxy group, or wherein $R_1$ and $R_2$ are interconnected to form a saturated or unsaturated $C_3$-$C_{30}$ ring: $R_3$, $R_3'$, $R_4$, $R^{4t}$, $R_5$ and $R_5'$ are each independently selected from the group consisting of a hydrogen, a hydroxy, a substituted or unsubstituted amino, a cyano, a halogen atom, a substituted or unsubstituted $C_1$-$C_{30}$ alkyl, a substituted or unsubstituted $C_3$-$C_{30}$ cycloalkyl, a substituted or unsubstituted $C_1$-$C_{30}$ alkoxy, a substituted or unsubstituted $C_6$-$C_{30}$ aryl, a substituted or unsubstituted $C_6$-$C_{30}$ arylalkyl, and a substituted or unsubstituted $C_2$-$C_{30}$ heteroaryl group;

wherein $R_1$ and $R_2$ are not both hydrogen;

wherein m is an integer in the range of 2 to about 5,000;

wherein Ar is a substituted or unsubstituted $C_6$-$C_{30}$ arylene, or a substituted or unsubstituted $C_2$-$C_{30}$ heteroarylene group; and wherein n is a real number in the range of about 0.01 to about 1.

3. The cyclopentaphenanthrene-based compound of claim 2, wherein the Ar unit has a structure selected from the group consisting of structures represented by Formula 3:

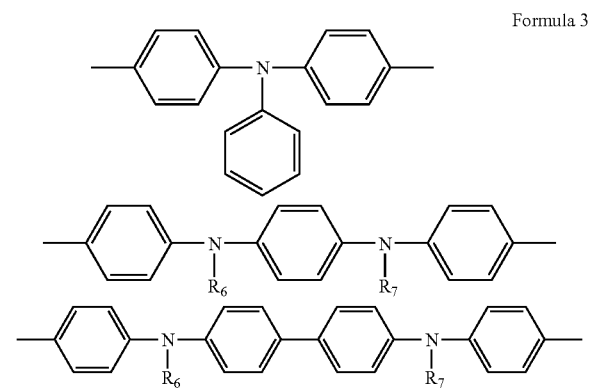

Formula 3

-continued

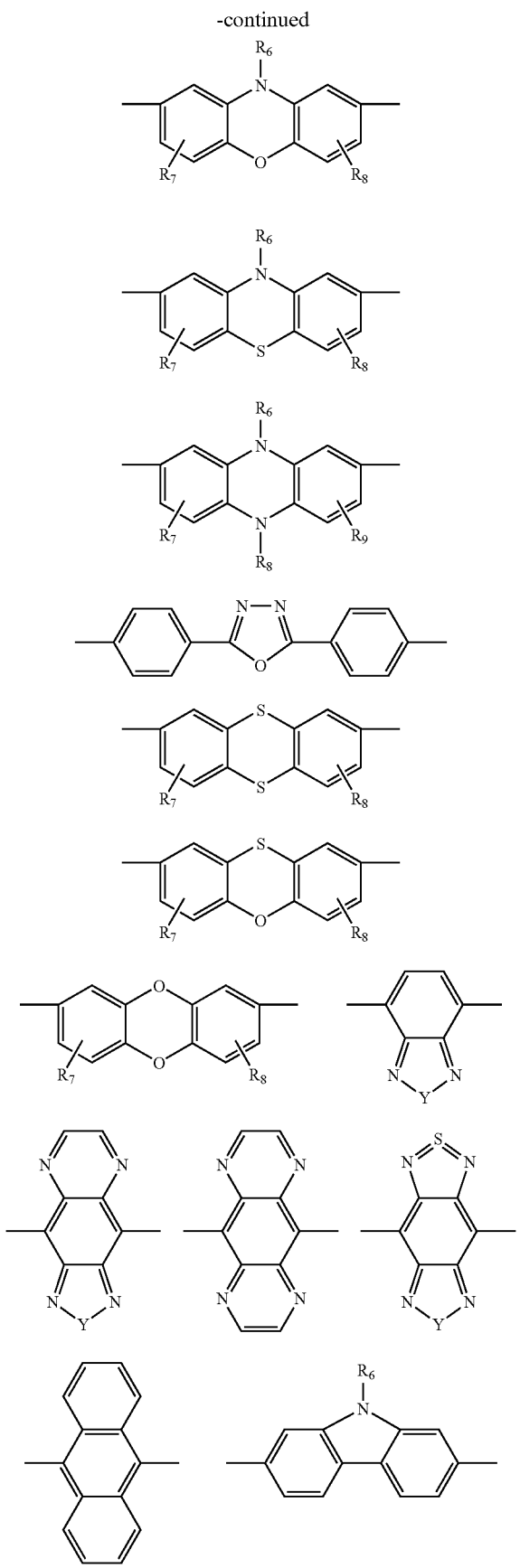

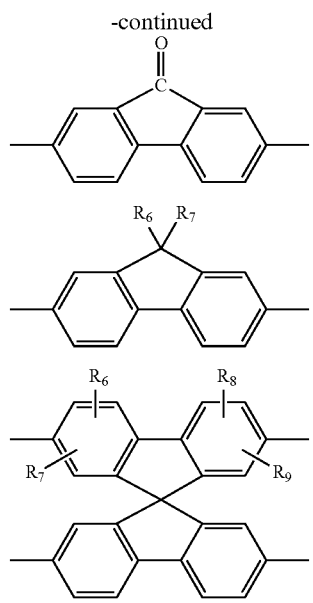

wherein Y is O or S; and wherein $R_6$, $R_7$, $R_8$ and $R_9$ are each independently selected from the group consisting of a hydrogen, a hydroxyl, a substituted or unsubstituted amino, a cyano, a halogen atom, a substituted or unsubstituted $C_1$-$C_{30}$ alkyl, a substituted or unsubstituted $C_3$-$C_{30}$ cycloalkyl, a substituted or unsubstituted $C_1$-$C_{30}$ alkoxy, a substituted or unsubstituted $C_6$-$C_{30}$ aryl, and a substituted or unsubstituted $C_2$-$C_{30}$ heteroaryl group.

4. The cyclopentaphenanthrene-based compound of claim 2 represented by Formula 4, Formula 4

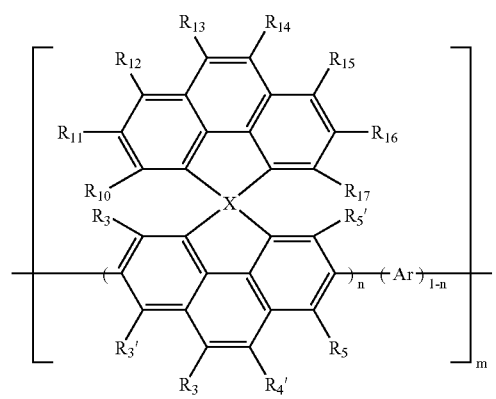

wherein $R_{10}$, $R_{11}$, $R_{12}$, $R_{13}$, $R_{14}$, $R_{15}$, $R_{16}$, and $R_{17}$ are each independently selected from the group consisting of a hydrogen, a hydroxy, a substituted or unsubstituted amino, a cyano, a halogen atom, a substituted or unsubstituted $C_1$-$C_{30}$ alkyl, a substituted or unsubstituted $C_3$-$C_{30}$ cycloalkyl, a substituted or unsubstituted $C_1$-$C_{30}$ alkoxy, a substituted or unsubstituted $C_6$-$C_{30}$ aryl, a substituted or unsubstituted $C_6$-$C_{30}$ aryloxy, a substituted or unsubstituted $C_6$-$C_{30}$ arylalkyl, a substituted or unsubstituted $C_2$-$C_{30}$ heteroaryl, and a substituted or unsubstituted $C_2$-$C_{30}$ heteroaryloxy group.

5. The cyclopentaphenanthrene-based compound of claim 1 represented by Formula 5,

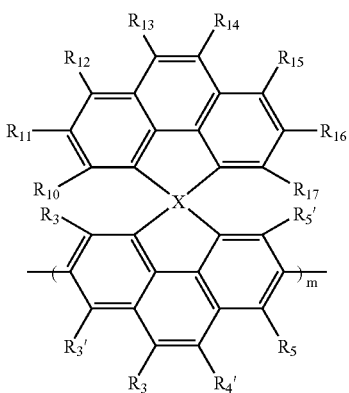

Formula 5 wherein $R_{10}$, $R_{11}$, $R_{12}$, $R_{13}$, $R_{14}$, $R_{15}$, $R_{16}$, and $R_{17}$ are each independently selected from the group consisting of a hydrogen, a hydroxy, a substituted or unsubstituted amino, a cyano, a halogen atom, a substituted or unsubstituted $C_1$-$C_{30}$ alkyl, a substituted or unsubstituted $C_3$-$C_{30}$ cycloalkyl, a substituted or unsubstituted $C_1$-$C_{30}$ alkoxy, a substituted or unsubstituted $C_6$-$C_{30}$ aryl, a substituted or unsubstituted $C_6$-$C_{30}$ aryloxy, a substituted or unsubstituted $C_6$-$C_{30}$ arylalkyl, a substituted or unsubstituted $C_2$-$C_{30}$ heteroaryl, and a substituted or unsubstituted $C_2$-$C_{30}$ heteroaryloxy group.

6. The cyclopentaphenanthrene-based compound of claim 1 represented by Formula 6,

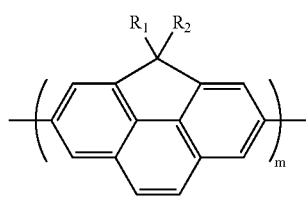

Formula 6 wherein $R_1$ and $R_2$ are each independently a substituted or unsubstituted $C_1$-$C_{12}$ alkyl group.

7. The cyclopentaphenanthrene-based compound of claim 6 represented by Formula 7,

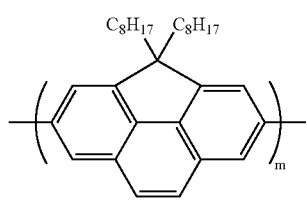

Formula 7

8. The cyclopentaphenanthrene-based compound of claim 2 represented by Formula 8,

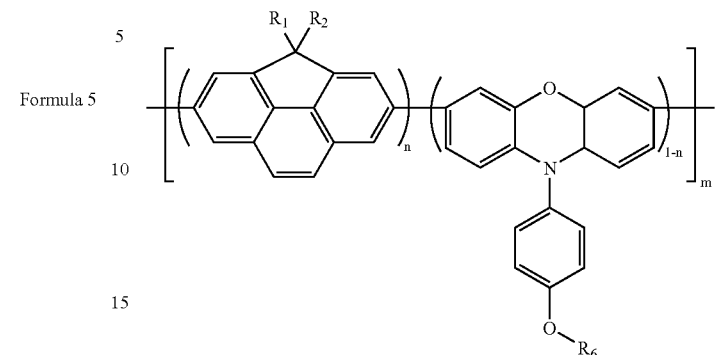

Formula 8 wherein $R_1$, $R_2$ and $R_6$ are each independently a substituted or unsubstituted $C_1$-$C_{12}$ alkyl group; and
wherein n is a real number in the range of about 0.01 to about 0.99.

9. The cyclopentaphenanthrene-based compound of claim 8 represented by Formula 9, Formula 9

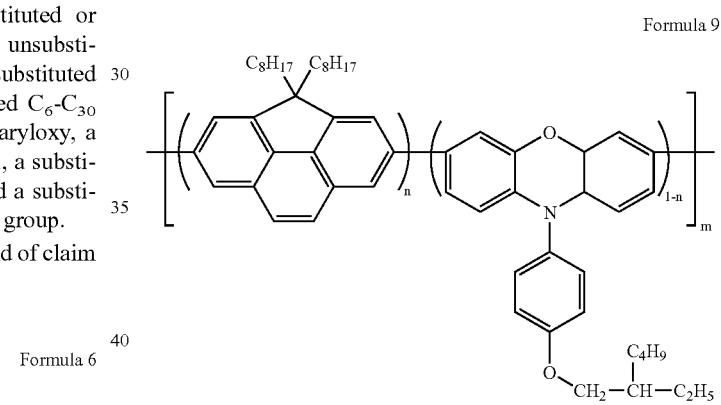

10. An organic electroluminescent device, comprising: an organic layer between a pair of electrodes, wherein the organic layer comprises a cyclopentaphenanthrene-based compound of:

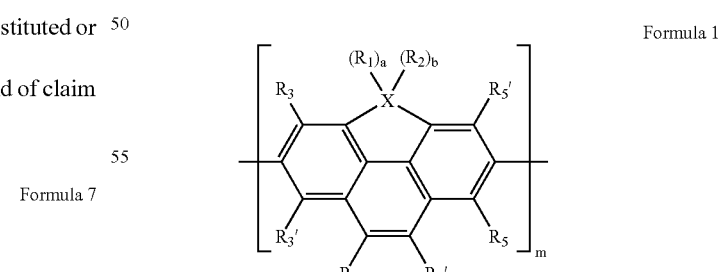

Formula 1 wherein X is C, N, O or S, where when X is C, a and b are both 1, when X is N, one of a and b is 0, and when X is O or S, a and b are both 0;
wherein $R_1$ and $R_2$ are each independently selected from the group consisting of a hydrogen, a substituted or unsubstituted $C_1$-$C_{30}$ alkyl, a substituted or unsubstituted $C_3$-$C_{30}$ cycloalkyl, a substituted or unsubstituted $C_1$-$C_{30}$ alkoxy, a substituted or unsubstituted $C_6$-$C_{30}$ aryl, a substituted or unsubstituted $C_6$-$C_{30}$ aryloxy, a substituted or unsubstituted $C_6$-$C_{30}$ arylalkyl, a substituted or unsubstituted $C_2$-$C_{30}$ heteroaryl, a substituted or unsubstituted $C_6$-$C_{30}$ heteroaryloxy, and a substituted or unsubstituted $C_2$-$C_{30}$ heteroaryloxy group, or $R_1$ and $R_2$ are interconnected to form a saturated or unsaturated $C_3$-$C_{30}$ ring; where $R_3$, $R_3'$, $R_4$, $R_4'$, $R_5$ and $R_5'$ are each independently selected from the group consisting of a hydrogen, a hydroxy, a substituted or unsubstituted amino, a cyano, a halogen atom, a substituted or unsubstituted $C_1$-$C_{30}$ alkyl, a substituted or unsubstituted $C_3$-$C_{30}$ cycloalkyl, a substituted or unsubstituted $C_1$-$C_{30}$ alkoxy, a substituted or unsubstituted $C_6$-$C_{30}$ aryl, a substituted or unsubstituted $C_6$-$C_{30}$ arylalkyl, and a substituted or unsubstituted $C_2$-$C_{30}$ heteroaryl group; and wherein m is an integer in the range of 2 to about 5,000.

11. The organic electroluminescence device of claim 10, wherein the organic layer is a light-emitting layer or a hole transport layer.

12. An organic electroluminescent device, comprising:
an organic layer between a pair of electrodes, wherein the organic layer comprises a cyclopentaphenanthrene-based compound of:

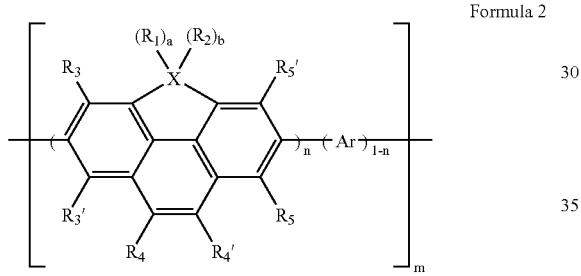

Formula 2 wherein X is C, N, O or S, where when X is C, a and b are both 1, when X is N, one of a and b is 0, and when X is O or S, a and b are both 0;

wherein $R_1$ and $R_2$ are each independently selected from the group consisting of a hydrogen, a substituted or unsubstituted $C_1$-$C_{30}$ alkyl, a substituted or unsubstituted $C_3$-$C_{30}$ cycloalkyl, a substituted or unsubstituted $C_1$-$C_{30}$ alkoxy, a substituted or unsubstituted $C_6$-$C_{30}$ aryl, a substituted or unsubstituted $C_6$-$C_{30}$ aryloxy, a substituted or unsubstituted $C_6$-$C_{30}$ arylalkyl, a substituted or unsubstituted $C_2$-$C_{30}$ heteroaryl, a substituted or unsubstituted $C_6$-$C_{30}$ heteroaryloxy and a substituted or unsubstituted $C_2$-$C_{30}$ heteroaryloxy group, or $R_1$ and $R_2$ are interconnected to form a saturated or unsaturated $C_3$-$C_{30}$ ring; where $R_3$, $R_3'$, $R_4$, $R_4'$, $R_5$ and $R_5'$ are each independently selected from the group consisting of a hydrogen, a hydroxy, a substituted or unsubstituted amino, a cyano, a halogen atom, a substituted or unsubstituted $C_1$-$C_{30}$ alkyl, a substituted or unsubstituted $C_3$-$C_{30}$ cycloalkyl, a substituted or unsubstituted $C_1$-$C_{30}$ alkoxy, a substituted or unsubstituted $C_6$-$C_{30}$ aryl, a substituted or unsubstituted $C_6$-$C_{30}$ arylalkyl, and a substituted or unsubstituted $C_2$-$C_{30}$ heteroaryl group;

wherein m is an integer in the range of 2 to about 5,000;

wherein Ar is a substituted or unsubstituted $C_6$-$C_{30}$ arylene, or a substituted or unsubstituted $C_2$-$C_{30}$ heteroarylene group; and wherein n is a real number in the range of about 0.01 to about 1.

13. The organic electroluminescence device of claim 12, wherein the Ar unit has a structure selected from the group consisting of:

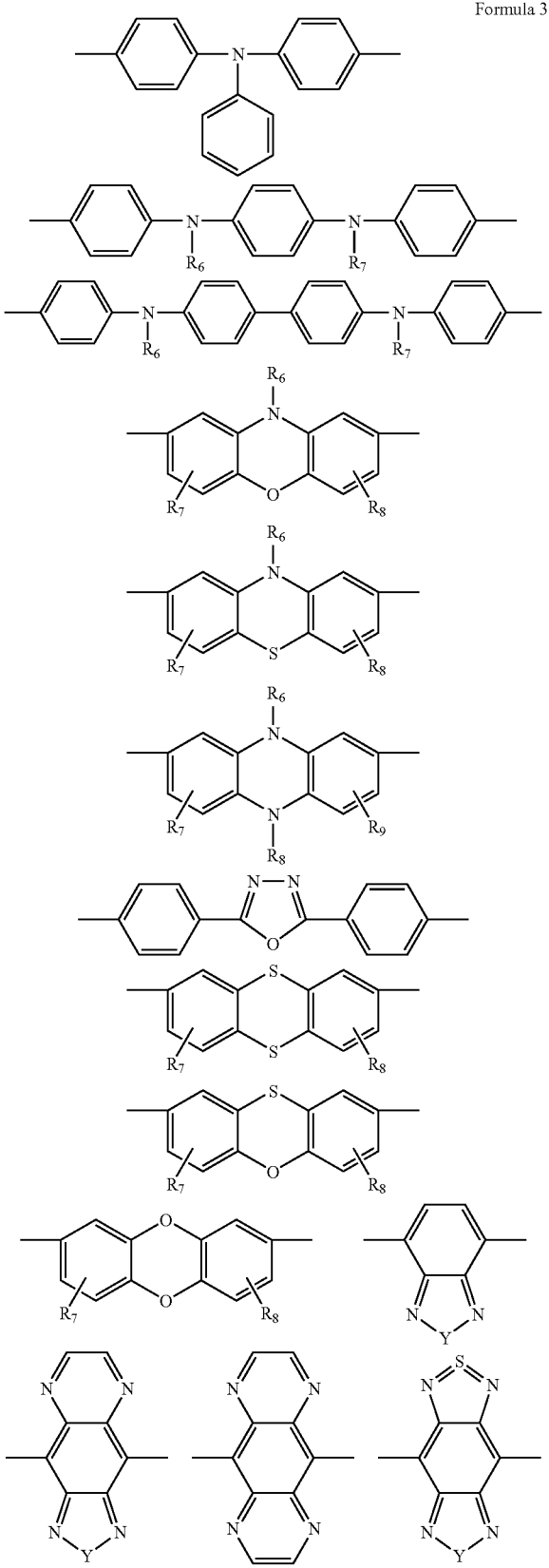

Formula 3

-continued

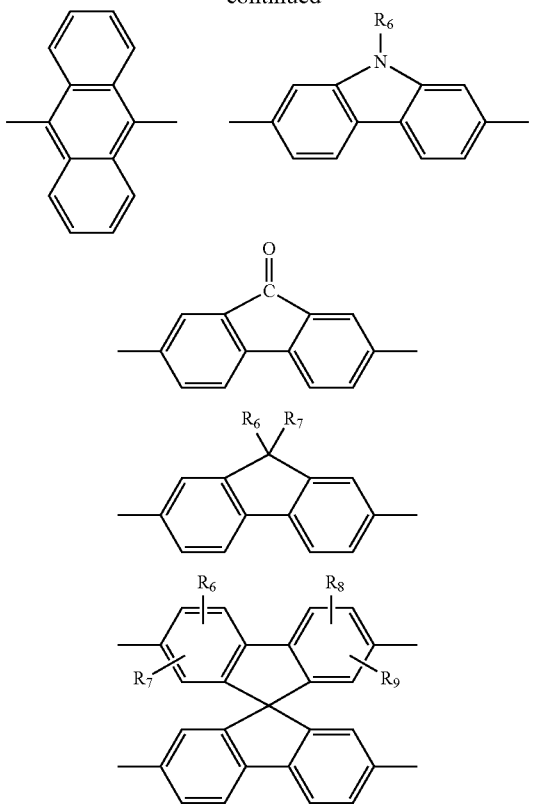

wherein Y is O or S; and
wherein $R_6$, $R_7$, $R_8$ and $R_9$ are each independently selected from the group consisting of a hydrogen, a hydroxyl, a substituted or unsubstituted amino, a cyano, a halogen atom, a substituted or unsubstituted $C_1$-$C_{30}$ alkyl, a substituted or unsubstituted $C_3$-$C_{30}$ cycloalkyl, a substituted or unsubstituted $C_1$-$C_{30}$ alkoxy, a substituted or unsubstituted $C_6$-$C_{30}$ aryl, and a substituted or unsubstituted $C_2$-$C_{30}$ heteroaryl group.

14. The organic electroluminescence device of claim 12, wherein the cyclopentaphenanthrene-based compound is represented by Formula 4, Formula 4

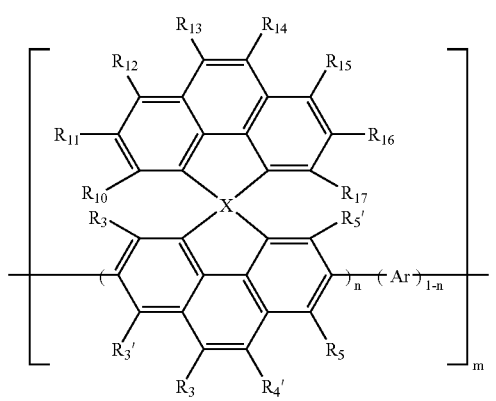

wherein $R_{10}$, $R_{11}$, $R_{12}$, $R_{13}$, $R_{14}$, $R_{15}$, $R_{16}$, and $R_{17}$ are each independently selected from the group consisting of a hydrogen, a hydroxy, a substituted or unsubstituted amino, a cyano, a halogen atom, a substituted or unsubstituted $C_1$-$C_{30}$ alkyl, a substituted or unsubstituted $C_3$-$C_{30}$ cycloalkyl, a substituted or unsubstituted $C_1$-$C_{30}$ alkoxy, a substituted or unsubstituted $C_6$-$C_{30}$ aryl, a substituted or unsubstituted $C_6$-$C_{30}$ aryloxy, a substituted or unsubstituted $C_6$-$C_{30}$ arylalkyl, a substituted or unsubstituted $C_2$-$C_{30}$ heteroaryl, and a substituted or unsubstituted $C_2$-$C_{30}$ heteroaryloxy group.

15. The organic electroluminescence device of claim 10, wherein the cyclopentaphenanthrene-based compound is represented by Formula 5, Formula 5

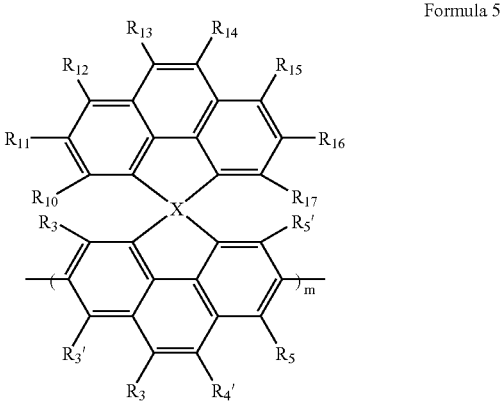

wherein $R_{10}$, $R_{11}$, $R_{12}$, $R_{13}$, $R_{14}$, $R_{15}$, $R_{16}$, and $R_{17}$ are each independently selected from the group consisting of a hydrogen, a hydroxy, a substituted or unsubstituted amino, a cyano, a halogen atom, a substituted or unsubstituted $C_1$-$C_{30}$ alkyl, a substituted or unsubstituted $C_3$-$C_{30}$ cycloalkyl, a substituted or unsubstituted $C_1$-$C_{30}$ alkoxy, a substituted or unsubstituted $C_6$-$C_{30}$ aryl, a substituted or unsubstituted $C_6$-$C_{30}$ aryloxy, a substituted or unsubstituted $C_6$-$C_{30}$ arylalkyl, a substituted or unsubstituted $C_2$-$C_{30}$ heteroaryl, and a substituted or unsubstituted $C_2$-$C_{30}$ heteroaryloxy group.

16. The organic electroluminescence device of claim 10, wherein the cyclopentaphenanthrene-based compound is represented by Formula 6, Formula 6

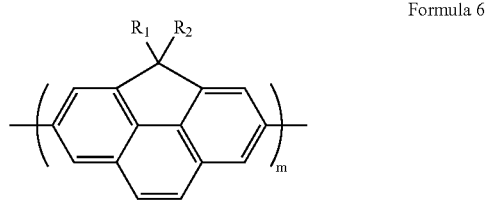

wherein $R_1$ and $R_2$ are each independently a substituted or unsubstituted $C_1$-$C_{12}$ alkyl group.

17. The organic electroluminescence device of claim 16, wherein the cyclopentaphenanthrene-based compound is represented by Formula 7,

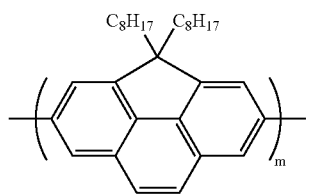

Formula 7

18. The organic electroluminescence device of claim 12, wherein the cyclopentaphenanthrene-based compound is represented by Formula 8,

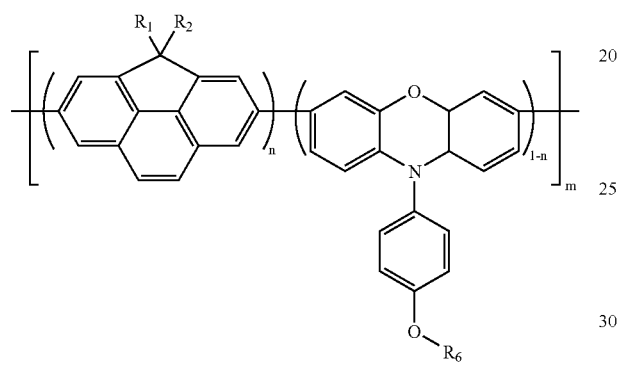

Formula 8 wherein $R_1$, $R_2$ and $R_6$ are each independently a substituted or unsubstituted $C_1$-$C_{12}$ alkyl group; and wherein n is a real number in the range of about 0.01 to about 0.99.

19. The organic electroluminescence device of claim 18, wherein the cyclopentaphenanthrene-based compound is represented by Formula 9,

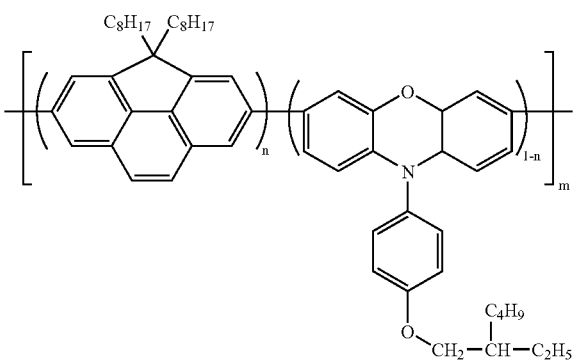

Formula 9 where n is a real number in the range of about 0.01 to about 0.99; and m is an integer in the range of 2 to about 5,000.

* * * * *